United States Patent
Kim et al.

(10) Patent No.: US 8,411,219 B2
(45) Date of Patent: Apr. 2, 2013

(54) LIQUID CRYSTAL DISPLAY DEVICE AND MANUFACTURING METHOD OF THE SAME

(75) Inventors: Younghoon Kim, Goyang-si (KR); Joongmin Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 12/973,397

(22) Filed: Dec. 20, 2010

(65) Prior Publication Data

US 2011/0157509 A1 Jun. 30, 2011

(30) Foreign Application Priority Data

Dec. 30, 2009 (KR) .................. 10-2009-0133559

(51) Int. Cl.
 *G02F 1/136218* (2006.01)
(52) U.S. Cl. ........................................ 349/44
(58) Field of Classification Search .................. None
See application file for complete search history.

(56) References Cited

U.S. PATENT DOCUMENTS

2003/0020847 A1* 1/2003 Kim et al. ................ 349/43
2003/0117573 A1* 6/2003 Yi et al. .................... 349/158
2004/0114060 A1* 6/2004 Kim et al. ................. 349/44
2009/0303407 A1* 12/2009 Lee ............................ 349/44

* cited by examiner

*Primary Examiner* — Thanh-Nhan P Nguyen
(74) *Attorney, Agent, or Firm* — McKenna Long & Aldridge, LLP (57) ABSTRACT

The present disclosure relates to a liquid crystal display device having a protection element for semiconductor layer from externally intruding light and a manufacturing method of the same. The present disclosure suggests a liquid crystal display device comprising a substrate; a data line and a gate line crossing each other on the substrate; a thin film transistor formed at a crossing portion of the data line and the gate line; a passivation layer covering the thin film transistor; and an opaque protective layer forming on the passivation layer and covering the thin film transistor. The liquid crystal display device according to the present disclosure blocks the light intrusion into the semiconductor active layer of the thin film transistor to enhance the electron mobility in the active layer and the reliability of the elements.

11 Claims, 8 Drawing Sheets

FIG. 1

Related Art

LIQUID CRYSTAL DISPLAY DEVICE AND MANUFACTURING METHOD OF THE SAME

This application claims the benefit of Korea Patent Application No. 10-2009-0133559 filed on Dec. 30, 2009, which is incorporated herein by reference for all purposes as if fully set forth herein.

BACKGROUND OF THE INVENTION

1. Field of the Invention

The present disclosure relates to a liquid crystal display device and a manufacturing method of the same. Especially, the present disclosure relates to a liquid crystal display device having a protection element for semiconductor layer from externally intruding light and a manufacturing method of the same.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), and electroluminescence device (or ED).

The liquid crystal display device represents video data by controlling the light transmitivity of the liquid crystal layer using the electric fields. According to the direction of the electric field, the LCD can be classified in the two major types; one is vertical electric field type and the other is the horizontal electric field type.

For the vertical electric field type LCD, the common electrode formed on the upper substrate and the pixel electrode formed on the lower substrate are facing with each other for forming the electric field of which direction is perpendicular to the substrate face. The twisted nematic liquid crystal layer disposed between the upper substrate and the lower substrate is driven the vertical electric field. The vertical electric field type LCD has merit of higher aperture ratio, while it has demerit of narrower view angle about 90 degree.

For the horizontal electric field type LCD, the common electrode and the pixel electrode are formed on the same substrate in parallel. The liquid crystal layer disposed between the upper substrate and the lower substrate is driven in In-Plane-Switching (IPS) mode by the electric field parallel to the substrate face. The horizontal electric field type LCD has a merit of wider view angle over 160 degree.

Figure 1:
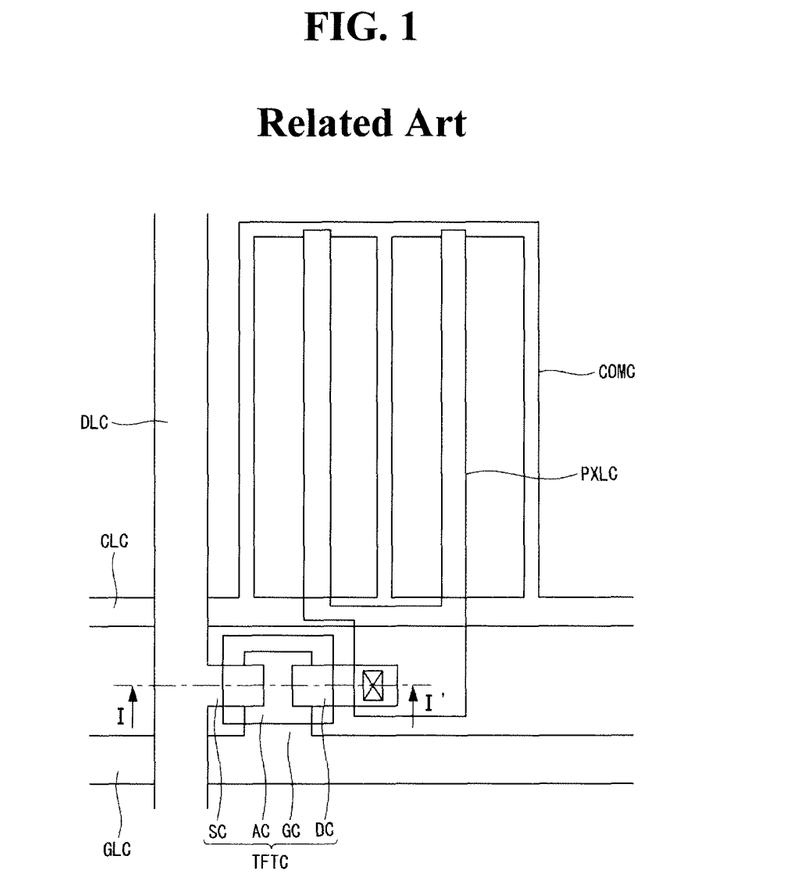
FIG. 1 is a plane view illustrating the horizontal electric field type liquid crystal display device according to the related art.
Figure 2:
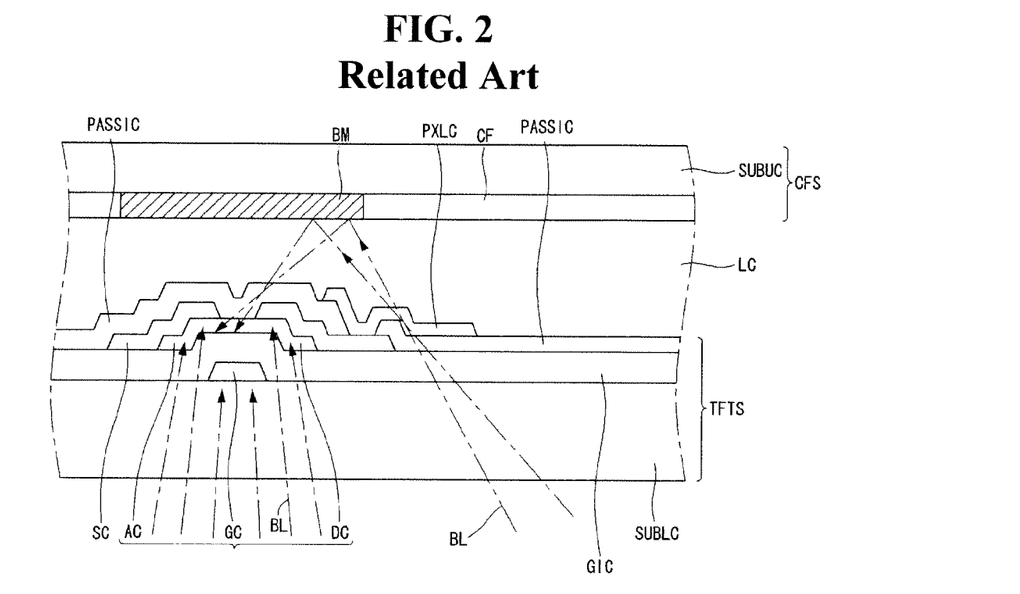
FIG. 2 is a cross-sectional view illustrating the structure of the liquid crystal display device of FIG. 1 by cutting along the line I-I'.

Hereinafter, we explain about the horizontal electric field type LCD in detail. FIG. 1 is a plane view illustrating the horizontal electric field type LCD according to the related art. FIG. 2 is a cross-sectional view cutting along the line I-I' for illustrating the structure of the horizontal electric field type LCD of the FIG. 1.

Referring to FIGS. 1 and 2, the horizontal electric field type LCD comprises a thin film transistor (or TFT) array substrate TFTS having the thin film transistor TFTC, a color filter array substrate CFS having the color filter CF and the black matrix BM, and a liquid crystal layer LC disposed the substrates (TFTS and CFS). The TFT array substrate of the horizontal electric field type LCD includes the gate line GLC and the data line DLC crossing each other on the lower substrate SUBLC, the thin film transistor TFTC formed at each crossing point of the gate line GLC and the data line DLC, the pixel electrode PXLC and the common electrode COMC forming the horizontal electric field within the pixel area defined by the crossing structure of the gate line GLC and the data line DLC, and the common line CLC connecting the common electrode COMC.

The thin film transistor TFTC includes the gate electrode GC branching from the gate line GLC, the semiconductor layer AC overlapping with the gate electrode GC on the gate insulating layer GIC covering the gate electrode GC, the source electrode SC branching from the data line DLC and contacting one side of the semiconductor layer AC, and the drain electrode DC facing with the source electrode SC and contacting the other side of the semiconductor layer AC. On the thin film transistor TFTC, the passivation layer PAS SIC is formed to protect the thin film transistor TFTC. The pixel electrode PXLC is formed on the passivation layer PASSIC.

The gate line GLC supplies the gate signal to the gate electrode GC of the thin film transistor TFTC. The data line DLC supplies the pixel signal to the pixel electrode PXLC via the drain electrode DC of the thin film transistor TFTC. The gate line GLC and the data line DLC are crossed each other so they define the pixel area. The common line CLC which is disposed between each pixel area and parallel with the gate line GLC, supplies the reference voltage for driving the liquid crystal layer.

By responding to the gate signal of the gate line GLC, the thin film transistor TFTC turns on to supply the pixel signal from the data line DLC to the pixel electrode PXLC. The pixel electrode PXLC is connected to the drain electrode DC of the thin film transistor TFTC and formed within the pixel area. The common electrode COMC is connected to the common line CLC and formed within the pixel area. Especially, the pixel electrode PXLC and the common electrode COMC are parallel each other in the pixel area. To do this, the common electrode COMC has a plurality of segments which are disposed in parallel and spaced away from each other with predetermined distance, and the pixel electrode PXLC has a plurality of segments and each of them is disposed between the segments of the common electrode COMC.

Therefore, the horizontal electric field is formed between the pixel electrode PXLC on which the pixel signal is applied via the thin film transistor TFTC and the common electrode COMC on which the reference signal is applied via the common line CLC. Especially, the horizontal electric field is formed between the segment of the pixel electrode PXLC and the segment of the common electrode COMC.

By the horizontal electric field, the liquid crystal molecules arrayed in parallel direction between the thin film transistor array substrate TFTS and the color filter array substrate CFS can be rotated according to the dielectric anisotropy property. According to the rotating state, the light transmissivity through the pixel area will be varied and then the video data can be represented.

The liquid crystal display device as mentioned above uses back light BL radiated from the back light system (not shown) placed under the low substrate SUBLC of the LCD panel for representing the video data. Under this condition, the light entering into the thin film transistor array substrate TFTS may be blocked by the gate electrode GC and it may enter into the semiconductor layer AC by diffraction phenomena. Some back light BL entering into the pixel area and considered as not affecting to the semiconductor layer AC may intrude into the semiconductor layer AC exposed between the source electrode SC and the drain electrode DC by reflecting from the black matrix BM formed on the color filter array substrate CFS or the upper substrate SUBLC.

Figure 3:
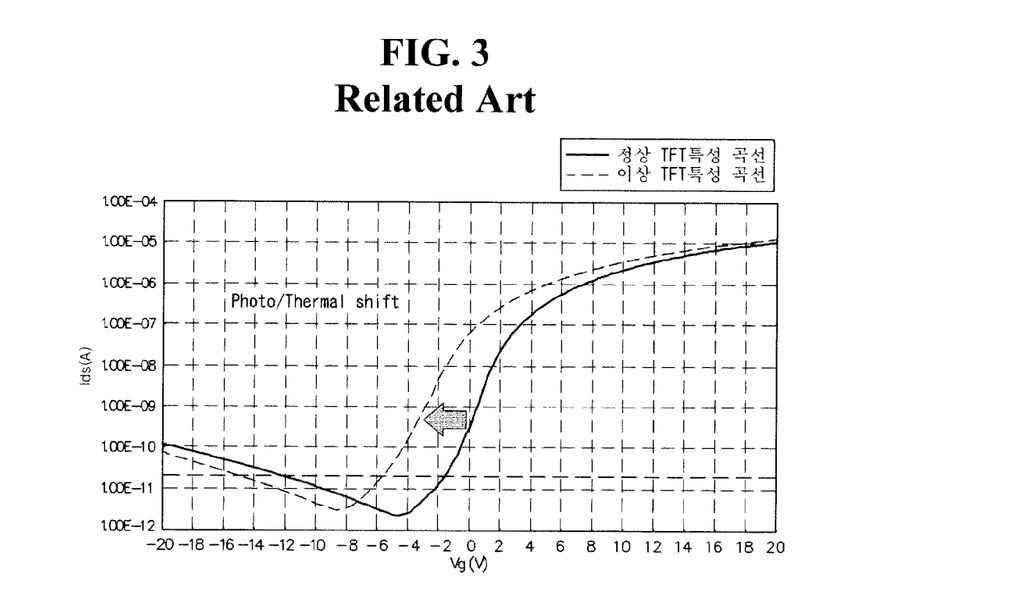
FIG. 3 is a graph showing the shift phenomenon occurred in the characteristic curve of the thin film transistor when the light intrudes into the active layer of the thin film transistor.

Like this, if the light is induced into the semiconductor layer AC of the thin film transistor TFTC, the characteristic curve of the thin film transistor TFTC will be shifted one side (especially, left) due to the optical and thermal stresses so that the property and performance of the thin film transistor TFTC may be degraded. FIG. 3 is a graph showing the shift phenomenon of the characteristic curve of the thin film transistor when the light enters into the TFT. As a result, the current leakage may be occurred and the thin film transistor TFTC may not transmit the pixel signal to the pixel electrode PXLC normally.

SUMMARY OF THE INVENTION

In order to overcome the above mentioned drawbacks, the purpose of the present disclosure is to suggest a liquid crystal display device having a structure for preventing back light from intruding into the thin film transistor, and a manufacturing method of the same. Another purpose of the present disclosure is to suggest a liquid crystal display device and a manufacturing method of the same in which two metal layers are disposed over and under the semiconductor layer to prevent the light from intruding into the semiconductor layer and to compose double gate structure.

In order to accomplish the above purpose, the present disclosure suggests a liquid crystal display device comprising a substrate; a data line and a gate line crossing each other on the substrate; a thin film transistor formed at a crossing portion of the data line and the gate line; a passivation layer covering the thin film transistor; and an opaque protective layer forming on the passivation layer and covering the thin film transistor.

The thin film transistor comprises: a gate electrode connecting to the gate line; a semiconductor layer formed within an area of the gate electrode on a gate insulation layer covering the gate electrode; a source electrode branching from the data line and contacting one side of the semiconductor layer; and a drain electrode facing with the source electrode and contacting the other side of the semiconductor layer.

The gate electrode and the opaque protective layer have a same size and are overlapping each other.

The opaque protective layer includes an opaque conductive material having at least one of molibdenium and titanium.

The opaque conductive material includes at least one of ITO (Indium Tin Oxide) and IZO (Indium Zinc Oxide) having a thickness thicker than a critical thickness.

The opaque protective layer connects to the gate electrode.

The liquid crystal display device further comprises a pixel electrode having a transparent conductive material connecting to the thin film transistor on the passivation layer.

The transparent conductive material includes at least one of ITO (Indium Tin Oxide) and IZO (Indium Zinc Oxide) having a thickness thinner than a critical thickness.

A manufacturing method of a liquid crystal display device comprising: forming a data line and a gate line which are crossing each other on a substrate, and a thin film transistor connecting to the data line and the gate line; depositing a passivation layer on the thin film transistor; and forming an opaque passivation layer covering the thin film transistor on the passivation layer.

The forming the thin film transistor comprises: forming the gate line and a gate electrode branching from the gate line on the substrate; forming a gate insulating layer covering the gate line and the gate electrode; forming a semiconductor layer within an area of the gate electrode on the gate insulating layer; and forming a source electrode branching from the data line and contacting one side of the semiconductor layer, and a drain electrode facing with the source electrode and contacting the other side of the semiconductor layer.

The forming the opaque passivation layer, the gate electrode and the opaque protective layer have a same size and are overlapping each other.

The forming the opaque passivation layer, the opaque protective layer is formed by depositing an opaque conductive material including at least one of molibdenium and titanium.

The forming the opaque passivation layer, the opaque protective layer is formed by depositing at least one of ITO (Indium Tin Oxide) and IZO (Indium Zinc Oxide) having a thickness thinner than a critical thickness.

The forming the passivation layer comprises: depositing a passivation material; and forming a gate contact hole exposing some portions of the gate electrode by penetrating the passivation layer and the gate insulating layer; and wherein the forming the opaque protective layer, the opaque protective layer contacts the gate electrode through the gate contact hole.

The forming the passivation layer comprises: depositing a passivation material; and forming a drain contact hole exposing some portions of the drain electrode by penetrating the passivation layer; and further comprising: forming a pixel electrode contacting the drain electrode through the drain contact hole on the passivation layer.

The forming the passivation layer comprises: depositing a passivation material; and forming a drain contact hole exposing some portions of the drain electrode by penetrating the passivation layer, and a gate contact hole exposing some portions of the gate electrode by penetrating the passivation layer and the gate insulating layer; and the forming the opaque protective layer comprises: depositing a transparent conductive material including at least one of ITO (Indium Tin Oxide) and IZO (Indium Zinc Oxide) having a thickness thicker than a critical thickness; and patterning the transparent conductive material to form the pixel electrode contacting the drain electrode through the drain contact hole, and the opaque protective layer contacting the gate electrode through the gate contact hole, wherein the opaque protective layer has a size same with the gate electrode with the thickness thicker than the critical thickness and overlaps with the gate electrode, and the pixel electrode has a thickness thinner than the critical thickness.

The liquid crystal display device according to the present disclosure blocks the light intrusion into the semiconductor active layer of the thin film transistor to enhance the electron mobility in the active layer and the reliability of the elements. Therefore, even though this TFT is used for a long time, any problem of picture quality such as yogore is not occurred and the good quality of the liquid crystal display device is ensured. Furthermore, as the present disclosure suggests the double gate thin film transistor, it is possible to desing the liquid crystal display device having smaller size of thin film transistor with the same performance and property. Therefore, the present disclosure suggests the liquid crystal display device having a high aperture ratio.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 4:
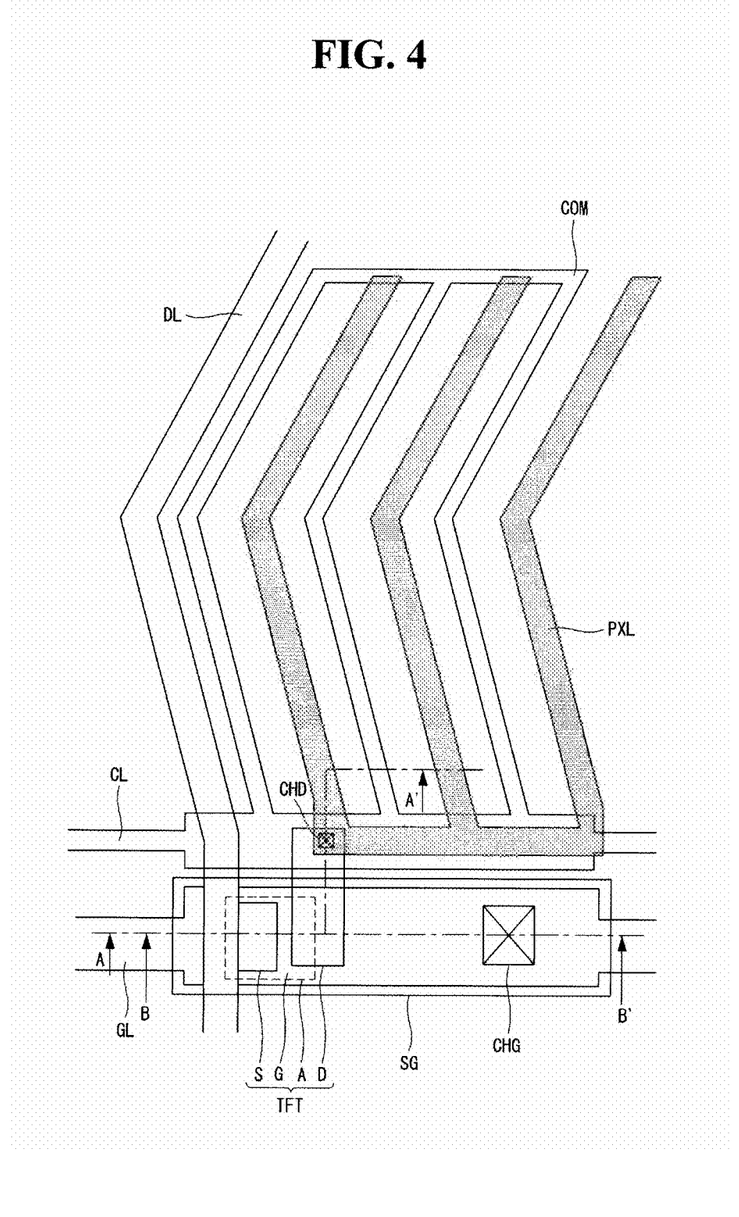
FIG. 4 a plane view illustrating a thin film transistor array substrate of the horizontal electric field type liquid crystal display device according to the present disclosure.
Figure 5:
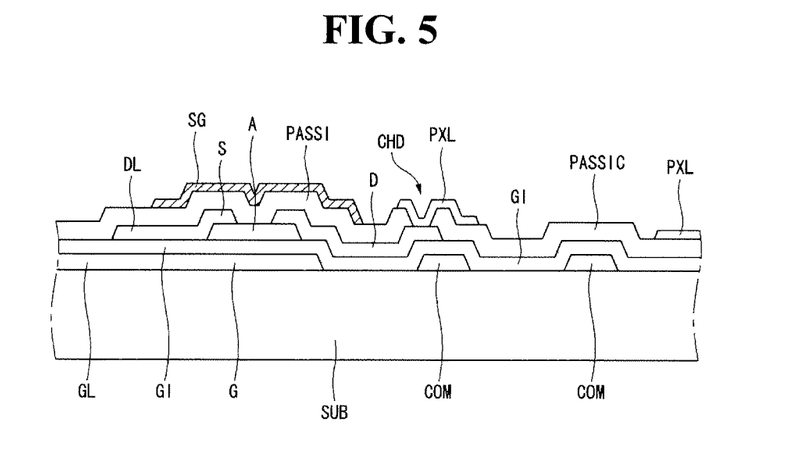
FIG. 5 is a cross-sectional view illustrating the structure of the thin film transistor array substrate of FIG. 4 by cutting along the line A-A'.
Figure 6:
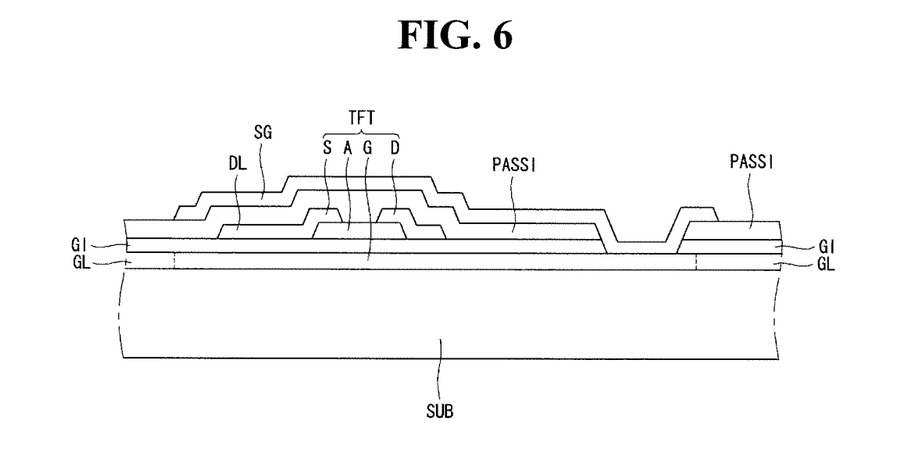
FIG. 6 is a cross-sectional view illustrating the structure of the thin film transistor array substrate of FIG. 4 by cutting along the line B-B'.

Referring to attached figures, we will explain preferred embodiments of the present disclosure. FIG. 4 a plane view illustrating a thin film transistor array substrate of the horizontal electric field type liquid crystal display device according to the present disclosure. FIG. 5 is a cross-sectional view illustrating the structure of the thin film transistor array substrate of FIG. 4 by cutting along the line A-A'. FIG. 6 is a cross-sectional view illustrating the structure of the thin film transistor array substrate of FIG. 4 by cutting along the line B-B'.

The horizontal electric field type liquid crystal display device according to the present disclosure comprises a thin film transistor array substrate TFTS having a plurality of thin film transistor TFT, a color filter array substrate (not shown) having a plurality of color filter (not shown), and a liquid crystal layer (not shown) disposed between the thin film transistor array substrate TFTS and the color filter array substrate. The thin film transistor array substrate TFTS of the horizontal electric field type LCD includes a gate line GL and a data line DL formed in crossing each other on a lower substrate SUB, a thin film transistor TFT formed at the crossing position, a pixel electrode PXL and a common electrode COM forming the horizontal electric field in a pixel area defined by the crossing of the gate line GL and the data line DL, and a common line CL connecting to the common electrode COM.

The thin film transistor TFT includes a gate electrode G branched from the gate line GL, an (semiconductor) active layer A overlapping with the gate electrode G on the gate insulating layer GI covering the gate electrode G, a source electrode S branched from the data line DL and contacting one side of the active layer A, and a drain electrode D facing with the source electrode S and contacting the other side of the active layer A.

Especially, preferably, the gate electrode G has a width wider than that of the gate line GL and become one portion of the gate line GL within the pixel electrode. The active layer A overlapping with the gate electrode G on the gate insulating layer GI preferably has a size smaller than that of the gate electrode G. With these structures, the active layer A can be protected by the gate electrode from any back light radiated from the lower direction.

The source electrode S is branched from the data line DL to overlap with the gate electrode G on the gate insulating layer, and contacts one side of the active layer A. In the plane view, the gate electrode G and the source electrode S are totally overlapped each other. The drain electrode D facing with the source electrode S contacts the other side of the active layer A. Furthermore, the drain electrode D extends along the direction of the data line DL outside of the gate electrode G to have connection portion with the pixel electrode PXL.

On the thin film transistor TFT, a passivation layer PASSI is formed to protect the thin film transistor TFT. The passivation layer PASSI has a drain contact hole CHD exposing some portions of the drain electrode D extruding from the gate electrode G area to the pixel area. Through the drain contact hole CHD, the drain electrode D contacts the pixel electrode PXL formed on the passivation layer PASSI. In the same way, the passivation layer PASSI and the gate insulating layer GI have a gate contact hole CHG exposing some portions of the gate electrode G. Preperably, the gate contact hole CHG is formed at farther position from the thin film transistor TFT.

Then, on the passivation layer PASSI, a protective layer SG including opaque metal and separating from the pixel electrode PXL is formed. Especially, preferably, the protective layer SG is formed as having a size same with that of the gate electrode G and overlapping with the gate electrode G. As a result, the active layer A of the thin film transistor TFT is protected by the gate electrode G and the protective layer SG from the light intruding from upper and lower sides. Furthermore, the protective layer SG preferably contacts the gate electrode G through the gate contact hole CHG. Accordingly, the thin film transistor TFT has a double gate structure having two gate electrodes at upper and lower sides of the active layer A, respectively.

When the thin film transistor TFT has the double gate structure, it is possible to make the thin film transistor TFT be smaller than that of the related art. Therefore, it is possible to reduce the area ratio occupying in the pixel area. Accordingly, the light transmittance area in the pixel area will be increased and the aperture ration will be enhanced.

The gate line GL supplies the gate signal to the gate electrode G. The data line DL supplies the pixel signal to the pixel electrode PXL via the drain electrode D of the thin film transistor TFT. The gate line GL and the data line DL are crossed each other so they define the pixel area. The common line CL which is disposed between each pixel area and parallel with the gate line GL, supplies the reference voltage for driving the liquid crystal layer.

By responding to the gate signal of the gate line GL, the thin film transistor TFT turns on to supply the pixel signal from the data line DL to the pixel electrode PXL. The pixel electrode PXL is connected to the drain electrode D of the thin film transistor TFT and formed within the pixel area. The common electrode COM is connected to the common line CL and formed within the pixel area. Especially, the pixel electrode PXL and the common electrode COM are parallel each other in the pixel area. To do this, the common electrode COM has a plurality of bent segments which are disposed in parallel and spaced away from each other with predetermined distance, and the pixel electrode PXL has a plurality of bent segments and each of them is disposed between the segments of the common electrode COM.

Therefore, the horizontal electric field is formed between the pixel electrode PXL on which the pixel signal is applied via the thin film transistor TFT and the common electrode COM on which the reference signal is applied via the common line CL. Especially, the horizontal electric field is formed between the bent segment of the pixel electrode PXL and the bent segment of the common electrode COM.

Hereinafter, explained is a manufacturing method of a thin film transistor array substrate of a liquid crystal display device according to the first embodiment of the present disclosure. FIGS. 7a to 7g are cross sectional views illustrating the steps of the manufacturing process for thin film transistor array substrate according to the first embodiment of the present disclosure. In the first embodiment, to explain about the double gate structure for preventing light intrusion into the thin film transistor, FIG. 7A to 7G are the cross sectional views cutting along the B-B' of FIG. 4.

Figure 7A:
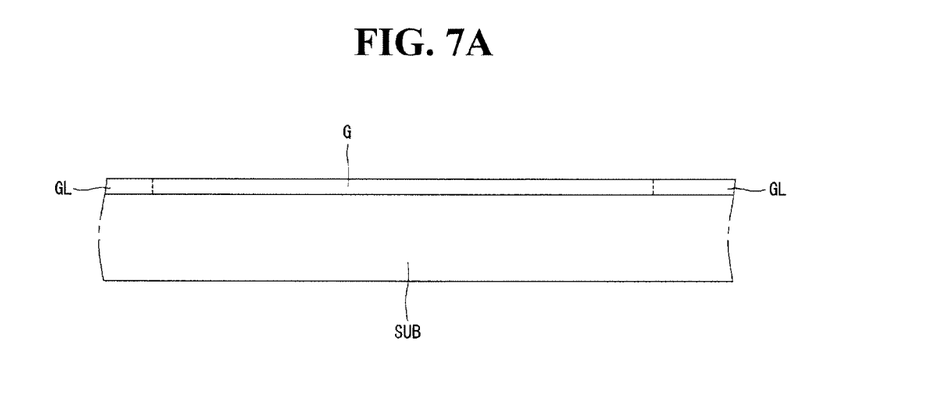
FIGS. 7A to 7G are cross sectional views illustrating the steps of the manufacturing process for thin film transistor array substrate according to the first embodiment of the present disclosure.

Referring to FIG. 7A, on a transparent substrate SUB, a metal material is deposited and patterned with a first mask to form gate elements. The gate elements include a gate line GL, a gate electrode G protruded from the gate line GL, a common line CL, and a common electrode COM connected to the common line CL.

Figure 7B:
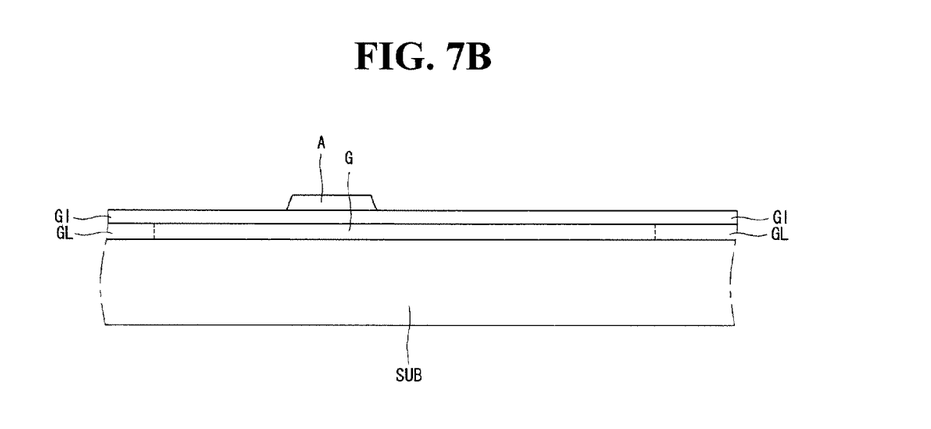

Referring to FIG. 7B, on the gate elements, a gate insulating layer GI is deposited to cover the whole substrate SUB. On the gate insulating layer GI, a semiconductor material is deposited and patterned with a second mask to form an active layer A. The active layer A is overlapping with the gate electrode G, while it has smaller size than the gate electrode G so that the active layer A is to be restricted within the range of the gate electrode G.

Figure 7C:
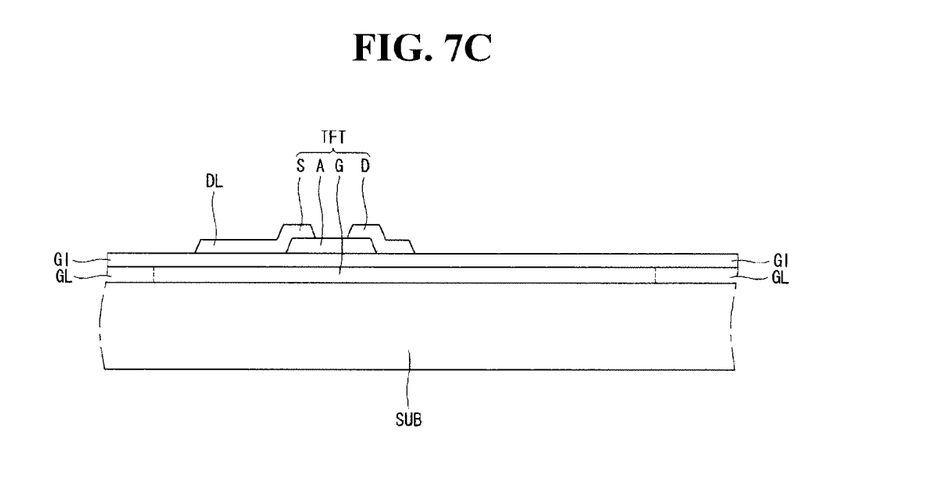

After completing the active layer A, a metal material is deposited on the whole surface of the substrate SUB and patterned with a third mask to form source-drain elements. The source-drain elements include a data line DL, a source electrode S branched from the data line DL and contacting one side of the active layer A, and a drain electrode D contacting the other side of the active layer A and facing with the source electrode S. The data line DL is perpendicularly crossing the gate line GL with the gate insulating layer therebetween. The source electrode S is disposed within the area of the gate electrode G. The drain electrode D is formed of which some portions are extruded from the area of the gate electrode G to the pixel area, as shown in FIG. 7C.

Figure 7D:
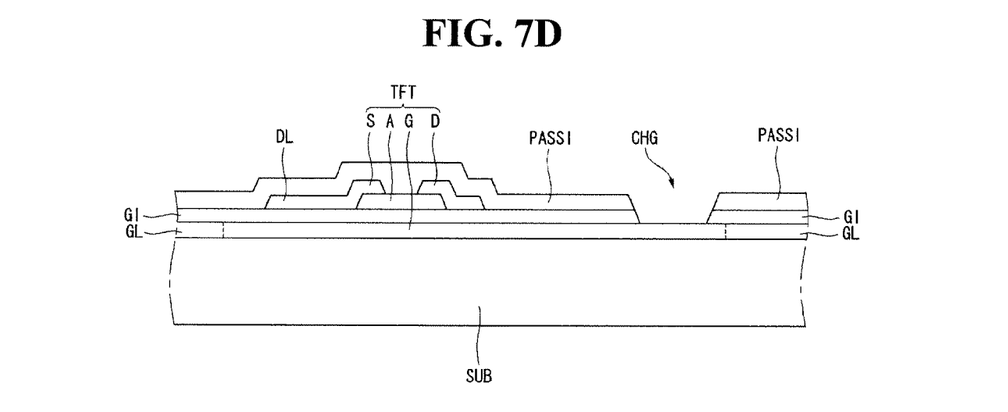

On the substrate SUB having the source-drain elements, an insulating material such as SiNx or SiOx is deposited to form a passivation layer PASSI. With a fourth mask, the passivation layer PASSI and the gate insulating layer GI covering the gate electrode G to form a gate contact hole CHG exposing some portions of the gate electrode, as shown in FIG. 7D.

Figure 7E:
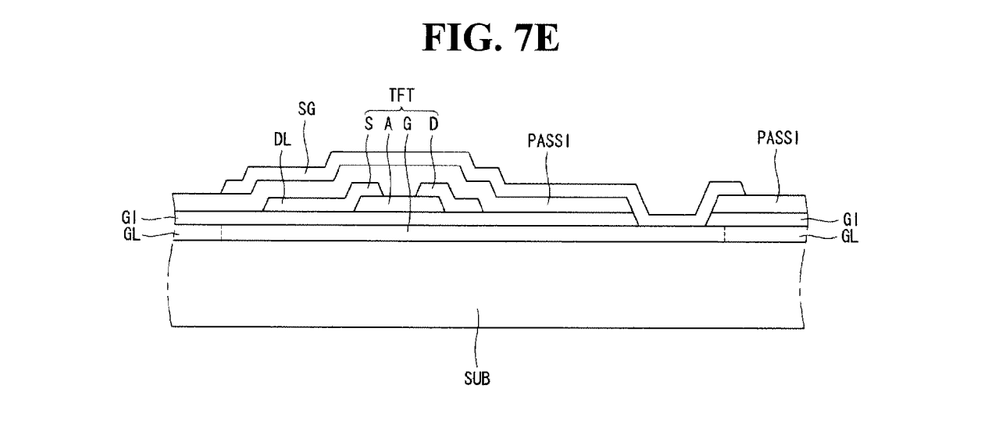

Referring to FIG. 7E, on the whole surface of the substrate SUB, an opaque metal layer is deposited using an alloy metal including molibdenium (Mo) and titanium (Ti) (i.e. Mo—Ti). Patterning the opaque metal layer with a fifth mask, a protective layer SG is formed to have substantially same size with the gate electrode G and to be overlapped with the gate electrode G. The protective layer SG contacts the gate electrode G through the gate contact hole CHG so it plays role of upper gate electrode of the thin film transistor TFT.

Figure 7F:
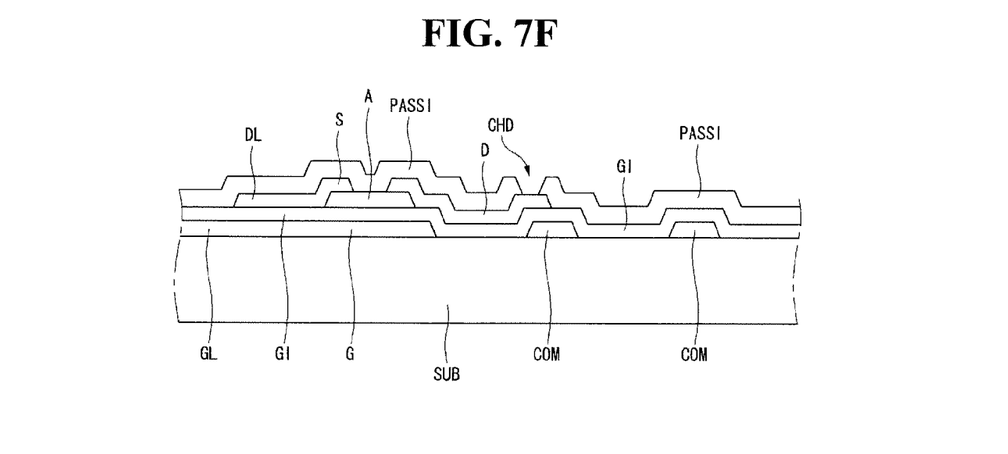

Until now, to explain focusing on the protective layer SG mainly, the cross-section views cutting along the B-B' line of FIG. 4 is used. Hereinafter, to explain focusing on the pixel electrode PXL, the cross-section views along the A-A' line will be used. Referring to FIG. 7, by patterning the passivation layer PASSI with a sixth mask, formed is a drain contact hole CHD exposing some portions of the drain electrode D extruded from the area of the gate electrode G to the pixel area, as shown in FIG. 7F.

Figure 7G:
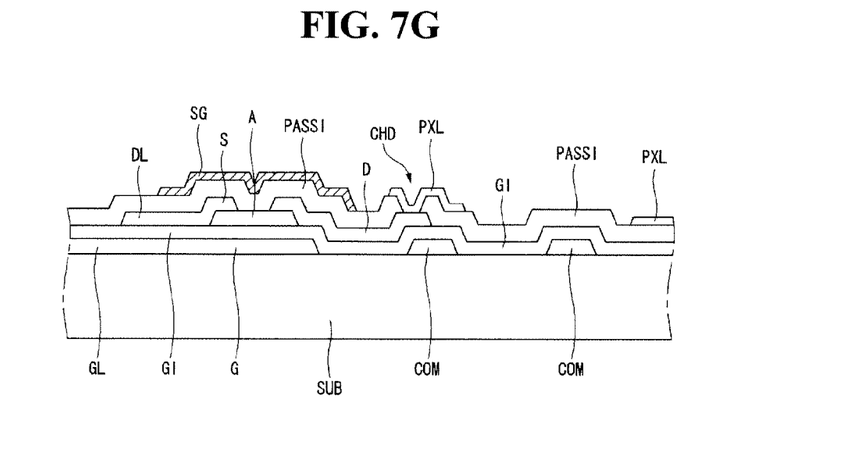

Referring to FIG. 7G, on the surface of the whole substrate SUB having the drain contact hole CHD, a transparent conductive material such as ITO (Indium-Tin-Oxide) or IZO (Indium-Zinc-Oxide) is deposited. Patterning the transparent conductive material with a seventh mask, a pixel electrode PXL is formed. The pixel electrode PXL is contacting the drain electrode D through the drain contact hole CHD. Furthermore, the pixel electrode PXL is parallel with the common electrode COM to form a horizontal electric field.

In the first embodiment, the protective layer SG and the pixel electrode PXL are formed in different steps. Therefore, at least seven mask processes are required. However, it is possible to reduce the number of mask processes by using the half-tone masks. In the second embodiment of the present disclosure, we will explain a manufacturing method of a thin film transistor array substrate having less mask processes than the first embodiment. In the second embodiment, the first to the third mask processes of the first embodiment are used as they are. To show the pixel electrode PXL and the protective layer SG at the same time, the cross sectional views cutting along A-A' line and B-B line would be shown in one figure. FIGS. 8A to 8E are cross sectional views illustrating the steps of the manufacturing process for thin film transistor array substrate according to the second embodiment of the present disclosure.

Figure 8A:
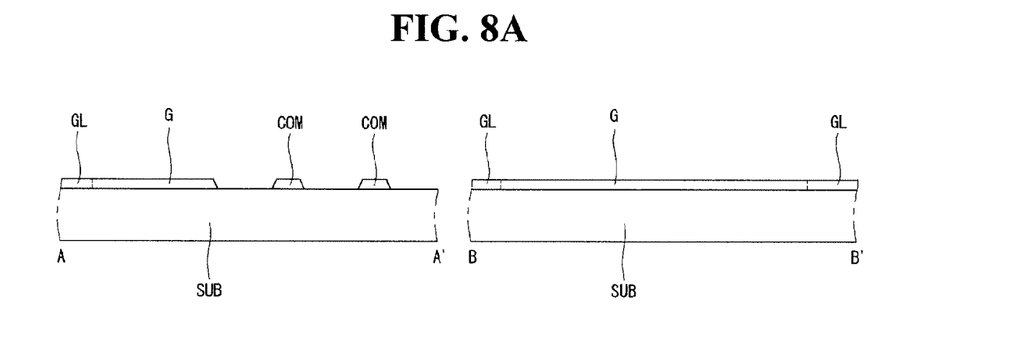
FIGS. 8A to 8E are cross sectional views illustrating the steps of the manufacturing process for thin film transistor array substrate according to the second embodiment of the present disclosure.
Figure 8B:
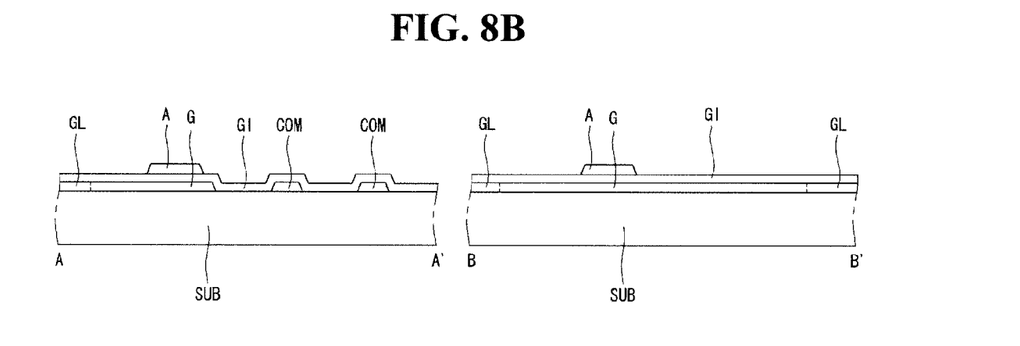

Referring to FIG. 8A, on a transparent substrate SUB, a metal material is deposited and patterned with a first mask to form gate elements. The gate elements include a gate line GL, a gate electrode G protruded from the gate line GL, a common line CL, and a common electrode COM connected to the common line CL.

Referring to FIG. 7B, on the gate elements, a gate insulating layer GI is deposited to cover the whole substrate SUB. Sequentially, a semiconductor material is deposited on the gate insulating layer G and patterned with a second mask to form an active layer A. The active layer A is overlapping with the gate electrode G, while it has smaller size than the gate electrode G so that the active layer A is to be restricted within the range of the gate electrode G.

Figure 8C:
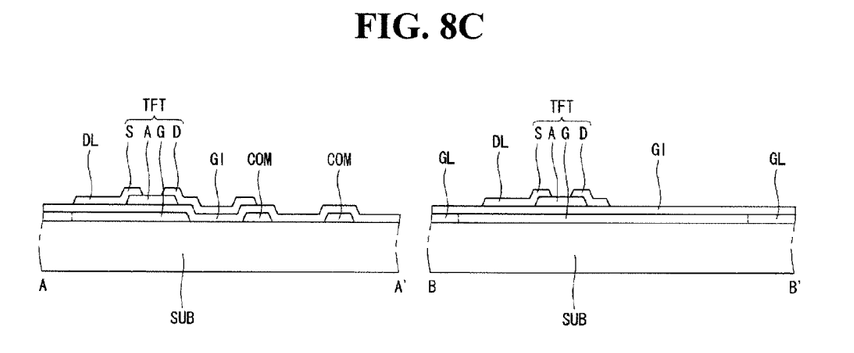

After completing the active layer A, a metal material is deposited on the whole surface of the substrate SUB and patterned with a third mask to form source-drain elements. The source-drain elements include a data line DL, a source electrode S branched from the data line DL and contacting one side of the active layer A, and a drain electrode D contacting the other side of the active layer A and facing with the source electrode S. The data line DL is perpendicularly crossing the gate line GL with the gate insulating layer therebetween. The source electrode S is disposed within the area of the gate electrode G. The drain electrode D is formed of which some portions are extruded from the area of the gate electrode G to the pixel area, as shown in FIG. 8C.

Figure 8D:
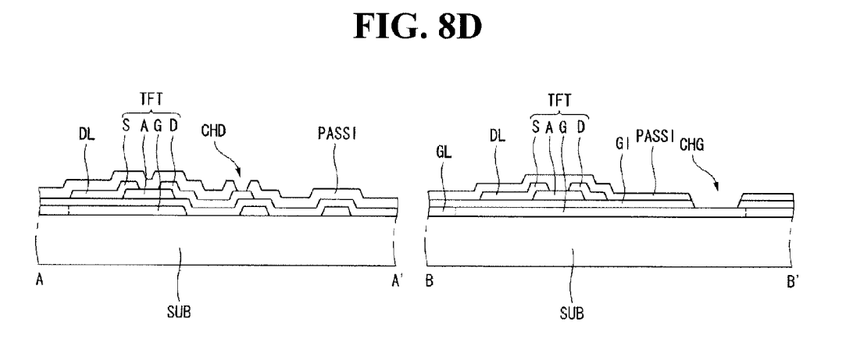

On the substrate SUB having the source-drain elements, a passivation layer PASSI is deposited. Using fourth mask, a half-tone mask, the gate insulating layer GI covering the drain electrode D and the gate insulating layer GI and the passivation layer PASSI covering the gate electrode G are patterned at the same time. Then, on the drain electrode D, a drain contact hole CHD penetrating the passivation layer PASSI is formed, while on the gate electrode G, a gate contact hole CHG penetrating the gate insulating layer GI and the passivation layer PASSI is formed, as shown in FIG. 8D.

Figure 8E:
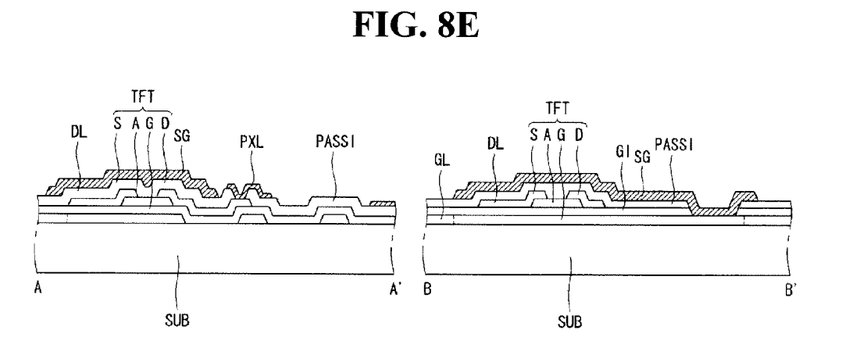

In the same way, on the passivation layer PASSI having the drain contact hole CHD and the gate contact hole CHG, a pixel electrode PXL and a passivation layer SG are simultaneously formed using a transparent conductive material such as ITO (Indium Tin Oxide) or IZO (Indium Zinc Oxide). The pixel electrode PXL would preferably be a transparent conductive layer while the protective layer SG would preferably be an opaque conductive layer. To form them at the same time with the same material, the thicknesses of them would be different. The ITO and IZO, as the oxidized conductive materials, have the transparency property when they are thinner than a predetermined thickness. Otherwise, when they are thicker than the predetermined thickness, they have the opaque property. This predetermined thickness is called the critical thickness. At first, on the passivation layer PASSI, ITO or IZO is deposited having thickness thicker than the critical thickness. And then, using a fifth mask, another half-tone mask, a transparent pixel electrode PXL thinner than the critical thickness and an opaque protective layer SG thicker than the critical thickness are formed, at the same time, as shown in FIG. 8E.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A liquid crystal display device comprising:
a substrate;
a data line and a gate line crossing each other on the substrate;
a thin film transistor formed at a crossing portion of the data line and the gate line, wherein the thin film transistor includes a gate electrode connecting to the gate line, a semiconductor layer formed within an area of the gate electrode on a gate insulation layer covering the gate electrode, a source electrode branching from the data line and contacting one side of the semiconductor layer, and a drain electrode facing with the source electrode and contacting the other side of the semiconductor layer;
a passivation layer covering the thin film transistor; and
an opaque protective layer forming on the passivation layer, including an opaque conductive material, connecting to the gate electrode and covering the thin film transistor.

2. The device according to the claim 1, wherein the gate electrode and the opaque protective layer have a same size and are overlapping each other.

3. The device according to the claim 1, wherein the opaque conductive material includes at least one of molybdenum and titanium.

4. The device according to the claim 1, wherein the opaque conductive material includes at least one of ITO (Indium Tin Oxide) and IZO (Indium Zinc Oxide) having a thickness thicker than a critical thickness, wherein the critical thickness is deciding a transparency property and an opaque property of a layer including at least one of the ITO and the IZO.

5. The device according to the claim 1, further comprising:
a pixel electrode having a transparent conductive material connecting to the thin film transistor on the passivation layer.

6. The device according to the claim 5, wherein the transparent conductive material includes at least one of ITO (Indium Tin Oxide) and IZO (Indium Zinc Oxide) having a thickness thinner than a critical thickness, wherein the critical thickness is deciding a transparency property and an opaque property of a layer including at least one of the ITO and the IZO.

7. A manufacturing method of a liquid crystal display device comprising:
forming a gate line and a gate electrode branching from the gate line on the substrate;
forming a gate insulating layer covering the gate line and the gate electrode;
forming a semiconductor layer within an area of the gate electrode on the gate insulating layer;
forming a data line crossing the gate line a source electrode branching from the data line and contacting one side of the semiconductor layer, and a drain electrode facing with the source electrode and contacting the other side of the semiconductor layer to complete a thin film transistor;
depositing a passivation layer on the thin film transistor;
forming a gate contact hole exposing some portions of the gate electrode by penetrating the passivation layer and the gate insulating layer; and
forming an opaque protective layer covering the thin film transistor on the passivation layer and contacting the gate electrode through the gate contact hole.

8. The device according to the claim 7, wherein the forming the opaque protective layer, the gate electrode and the opaque protective layer have a same size and are overlapping each other.

9. The device according to the claim 7, wherein the forming the opaque protective layer, the opaque protective layer is formed by depositing an opaque conductive material including at least one of molybdenum and titanium.

10. The method according to the claim 7, wherein the forming the opaque protective layer, the opaque protective layer is formed by depositing at least one of ITO (Indium Tin Oxide) and IZO (Indium Zinc Oxide) having a thickness thinner than a critical thickness.

11. The method according to the claim 7, wherein the forming the gate contact hole further comprises:
forming a drain contact hole exposing some portions of the drain electrode by penetrating the passivation layer; and
the forming the opaque protective layer further comprises:
depositing a transparent conductive material including at least one of ITO (Indium Tin Oxide) and IZO (Indium Zinc Oxide) having a thickness thicker than a critical thickness; and
patterning the transparent conductive material to form the pixel electrode contacting the drain electrode through the drain contact hole,
wherein the opaque protective layer has a size same with the gate electrode with the thickness thicker than the critical thickness and overlaps with the gate electrode, and the pixel electrode has a thickness thinner than the critical thickness.

* * * * *